United States Patent [19]
Khayrallah

[11] Patent Number: 5,926,488
[45] Date of Patent: Jul. 20, 1999

[54] METHOD AND APPARATUS FOR DECODING SECOND ORDER REED-MULLER CODES

[75] Inventor: Ali S. Khayrallah, Apex, N.C.

[73] Assignee: Ericsson, Inc., Research Triangle Park, N.C.

[21] Appl. No.: 08/911,182

[22] Filed: Aug. 14, 1997

[51] Int. Cl.[6] .................................................. H03M 13/00
[52] U.S. Cl. ..................................... 371/37.01; 371/37.06
[58] Field of Search ............................... 371/37.01, 37.06

[56] References Cited

U.S. PATENT DOCUMENTS

| | | | |
|---|---|---|---|
| 4,896,353 | 1/1990 | Dehgani et al. ............................. | 380/6 |
| 4,959,842 | 9/1990 | Forney, Jr. ................................. | 375/39 |
| 5,442,627 | 8/1995 | Viterbi et al. .............................. | 370/22 |

OTHER PUBLICATIONS

J.H. Conway, et al., "Soft Decoding Techniques for Codes and Lattices, Including the Golay Code and the Leech Lattice,"—*On Information Theory*, V 32, No. 1 (1994), pp. 41–50.

H.T. Moorthy, et al., "Good Trellises for IC Implementation of Viterbi Decoders for Linear Block Codes," *IEEE Transactions on Communications*, V 45, No. 1, pp. 52–63.

W. W. Peterson, "Important Linear Codes," *Error–Correcting Codes*, pp. 72–77.

M. Ran, et al., "Constrained Designs for Maximum Likelihood of Soft Decoding of RM(2,m) and the Extended Golay Codes," *IEEE Transactions on Communications*, 43, No. 2/4 (Winter 1995), pp. 812–820.

A.R. Hammons, Jr., et al., "The $Z_4$–Linearity of Kerdock, Preparata, Goethals, and Related Codes," *IEEE Transactions on Information Theory*, 40, No. 2, (Spring 1994), pp. 301–319.

M. Ran, et al., "Concise Coset Representation for Maximum Likelihood Soft Decision Decoding RM(2,m) Codes," *Communication, Control, and Signal Processing*, 1990, pp. 287–293.

H.T. Moorthy, et al., "Good Trellises for IC Implementation of Viterbi Decoders for Linear Block Codes," *IEEE Transactions on Communications*, 45, No. 1 (Winter 1997), pp. 52–63.

J.H. Conway, et al., "Soft Decoding Techniques for Codes and Lattices, Including the Golay Code and the Leech Lattice," *IEEE Transactions on Information Theory*, 32, No. 1 (Winter 1986), pp. 41–50.

W. Peterson, "Error Correcting Codes," *The Mitt Press*, pp. 64–86.

EPO Standard Search Report No. RS 10061QUS, Apr. 16, 1998.

Elia et al., "Note in the Complete Decoding of Kerdock Codes", IEE Proceedings–I, vol. 139, No. 1, Feb. 1992, pp. 24–28.

*Primary Examiner*—Stephen M. Baker
*Attorney, Agent, or Firm*—Jenkens & Gilchrist, P.C.

[57] ABSTRACT

The Conway-Sloane decoding method presents a general premise that for any given highly complex block code, an attempt should be made to find a subcode of that given block code that is less complex to decode. The given complex block code may then be maximum likelihood decoded with reduced complexity by cycling over the subcode and its cosets. Extending this general premise to Reed-Muller codes, and in particular to a second order Reed-Muller (or Kerdock) code, reduced maximum likelihood decoding complexity is obtained by cycling over a found subcode (and its cosets) of the second order Reed-Muller (or Kerdock) code. A first order Reed-Muller code comprises just such a suitable subcode which, like the parity check for the Golay codes analyzed by Conway and Sloane, has a known less complex maximum likelihood decoding solution utilizing a fast Hadamard Transform.

14 Claims, 1 Drawing Sheet

METHOD AND APPARATUS FOR DECODING SECOND ORDER REED-MULLER CODES

BACKGROUND OF THE INVENTION

1. Technical Field of the Invention

The present invention relates to the decoding of digital data transmitted over a communications channel and, in particular, to a low complexity maximum likelihood decoder for second order Reed-Muller codes.

2. Description of Related Art

There exist many applications where large volumes of digital data must be transmitted and received in a substantially error free manner. In telecommunications systems, in particular, it is imperative that the reception of digital data be accomplished as reliably as is possible, however, because the communications channels (including radio frequency, fiber optic, coaxial cable, and twisted copper wire) utilized for data transmission are plagued by error introducing factors. For example, such errors may be attributable to transient conditions in the channel (like interference, noise or multi-path fading). The influence of such factors results in instances where the digital data is not transmitted properly or cannot be reliably received.

Considerable attention has been directed toward overcoming this problem and reducing the number of errors incurred when transmitting data. One option involves increasing transmitter power. However, this is typically not practical due to limitations regarding transmitter electronics, regulations on peak power transmission, and the added expense involved in increasing power levels. A preferable alternative option for combating noise on the communications channel is to introduce redundancy in the transmitted message which is used at the receiver to correct introduced errors. Such redundancy is typically implemented through the use of error control coding (channel codes). A preferable alternative option for combating fading on the communications channel is to use an interleaver to reorder the data prior to transmission over the channel. As a result, many communications systems now utilize a combination of error control coding/decoding and interleaving/de-interleaving processes to protect against the effects of interference, noise or multi-path fading on the communications channel.

Because of implementation complexity concerns, the error control decoder typically used comprises a soft decision decoder (and, in particular, an errors and erasures decoder). Such decoders exploit reliability values output from a demodulator in estimating the transmitted codeword. In the absence of fading, and in the presence of Gaussian noise, the optimal soft decision decoder is the maximum likelihood decoder. It is also typically the best decoder in the presence of fading (assuming a good estimate of the fading is available). For a general block code, however, maximum likelihood decoding can be hopelessly complex to implement. Accordingly, a need exists for a less complex maximum likelihood decoding scheme for implementation in connection with soft decision decoding of block codes.

For the special case of the (24,12) Golay code and the (23,12) extended Golay code, a maximum likelihood decoder having a very low complexity has been devised by Conway and Sloane (see, IEEE Trans. Infor. Theory, vol. 32, pp. 41–50, 1986). The premise behind the Conway-Sloane decoding method is that for a given Golay code, an attempt is made to find a subcode of that given Golay code that is easy to decode. The given Golay code may then be decoded by cycling, to achieve a lower overall complexity, over the subcode and its cosets. For the (24,12) Golay code, for example, it is noted that there is a subcode thereof which is equivalent to a parity check code. Such a parity check code presents a trivial decoding challenge. A more complete explanation of the operation of the Conway-Sloane decoding method may be obtained by referring to the previously mentioned IEEE article, or to U.S. application for patent Ser. No. 08/768,530, filed Dec. 18, 1996, by Ali S. Khayrallah, et al., the disclosures of which are hereby incorporated by reference.

The disclosed Conway-Sloane decoding method is limited on its face to application in connection with the Golay and extended Golay codes. Furthermore, an extension of the Conway-Sloane decoding method has been proposed by the above-referenced U.S. Application for Patent in decoding various shortened (19,7), (18,7) and (18,6) Golay codes. In spite of these advances relating to more efficient decoding of Golay codes, a need still exists for less complex maximum likelihood decoding schemes specifically addressing other types of codes. In particular, there is a need for such a scheme in connection with the decoding of second order Reed-Muller codes.

SUMMARY OF THE INVENTION

To address the foregoing and other problems, the decoder of the present invention processes a received vector of second order Reed-Muller (or Kerdock) encoded information by cycling over all of the cosets of a subcode of the second order Reed-Muller (or Kerdock) code, and performing a Fast Hadamard Transformation on the received vector with each cycle to obtain an intermediate codeword guess with respect to each examined coset. Once cycling through the cosets is completed, a final codeword guess (comprising the best one of the intermediate codeword guesses) of the received vector is obtained. The originally encoded information bits are then recovered from this final codeword guess.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
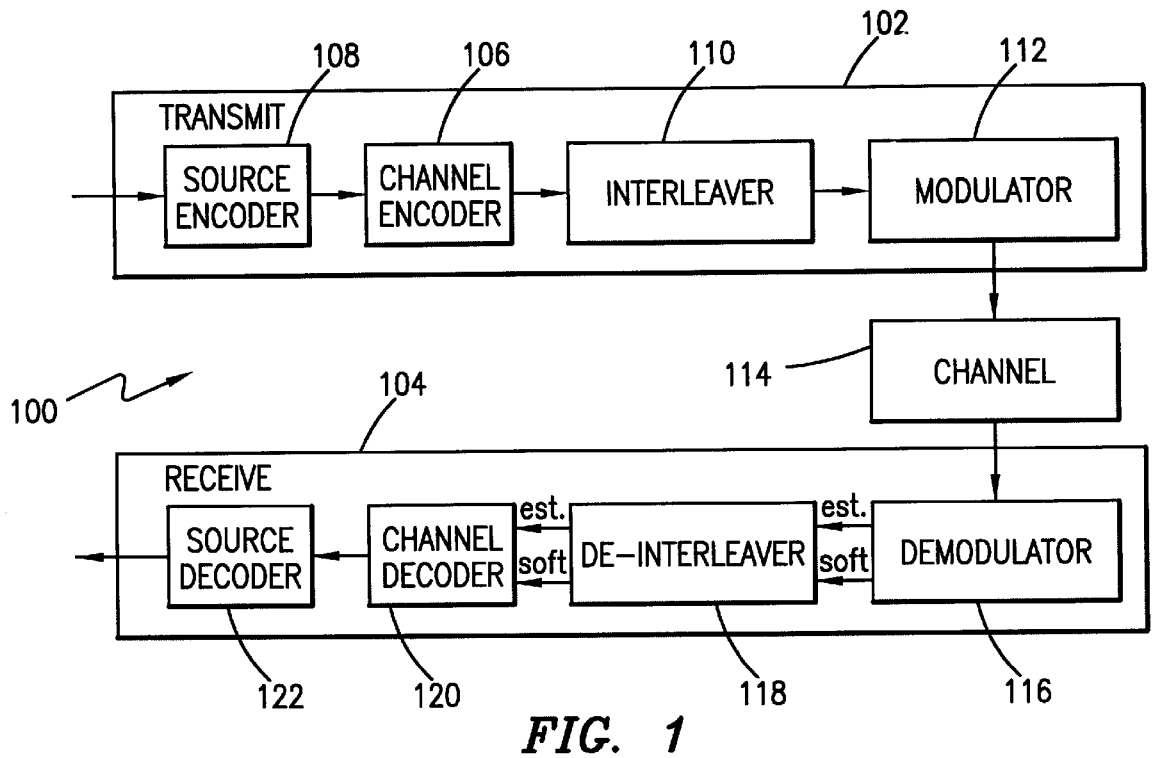
FIG. 1 is a functional block diagram of a block coding system of the present invention.

Reference is now made to FIG. 1, wherein there is shown a block diagram of a block coding system 100 of the present invention. The system 100 includes a transmit side 102 and a receive side 104. On the transmit side 102, the system 100 includes an (n,k;d) linear block channel encoder 106 wherein a block of "k" information bits received from an information source encoder 108 is encoded to output a codeword of "n" bits in length (wherein n>k). The channel encoder 106 preferably implements an error control code. An example of the information source encoder 108 is a vocoder or data compressor. The code words output from the channel encoder 106 are then rearranged by an interleaver 110. A modulator 112 then maps the rearranged code words into waveforms suited for transmission over a communications channel 114. An example of such a modulator 112 is any known modulator having an M-ary signal constellation (like quadrature amplitude modulation (QAM) or phase shift keying (PSK)). The communications channel 114 is typically a wireless medium which suffers from many error and distortion introducing problems including fading, interference and noise.

On the receive side 104, the system 100 includes an appropriate demodulator 116 that demodulates the communications channel 114 transmitted communication and outputs estimates of the rearranged code words. The demodulator 116 further outputs soft information comprising a reliability value for each estimated code word. The reliability values are indicative of the level of confidence expressed by the demodulator 116 in its estimate of a particular received and demodulated code word. Demodulators 116 producing code word estimates and reliability values are well known in the art, and thus will not be further described. Examples of such demodulators 116 include: a maximum aposterior probability (MAP) demodulator, or a soft output Viterbi algorithm (SOVA) demodulator/decoder. The estimated code words and corresponding soft information are then reordered (i.e., de-rearranged) by a de-interleaver 118. An (n,k;d) linear block channel decoder 120 then processes the reordered estimated code words and corresponding soft information to generate estimates of the information bits for output to an information source decoder 122. The channel decoder 120 preferably comprises a maximum likelihood decoder for the selected error control code which utilizes soft decision decoding.

In accordance with the present invention, the channel encoder 106 implements a second order Reed-Muller code. An (n,k;d) Reed-Muller code is determined by two parameters: m and r≦m, wherein:

$$n=2^m$$

$$n = 2^m$$

$$k = 1 + \binom{m}{1} + \cdots + \binom{m}{r}$$

$$d = 2^{m-r}$$

$$d=2^{m-r}$$

For r=1, a first order Reed-Muller code is presented, some examples of which include the (8,4;4) Reed-Muller code, the (16,5;8) Reed-Muller code and the (32,6;16) Reed-Muller code. For r=2, on the other hand, a second order Reed-Muller code is presented, some examples of which include the (16,11;4) Reed-Muller code, and the (32,16;8) Reed-Muller code. The channel encoder 106 of FIG. 1 preferably, but not exclusively, implements as its second order code the (32,16;8) Reed-Muller code. As an alternative, the channel encoder 106 may implement a class of nonlinear codes (commonly referred to as Kerdock codes) sandwiched between first and second order Reed-Muller codes.

Although the present invention focuses on the decoding of second order Reed-Muller (or Kerdock) codes, a more complete understanding of the present invention may be obtained from further understanding a well known less complex procedure used for maximum likelihood decoding of first order Reed-Muller codes. A Sylvester-type Hadamard matrix may be constructed as follows:

$$H_0 = [1] \tag{1}$$

$$H_m = \begin{bmatrix} H_{m-1} & H_{m-1} \\ H_{m-1} & -H_{m-1} \end{bmatrix} \tag{2}$$

The columns of $H^{(k)}$ are the code words of the Hadamard code in a specific order. One way to construct a first order $(2^m, m+1, 2^{m-1})$ Reed-Muller code is to take as code words the rows of $H_m$ (referred to as $y_0, \ldots, y_2{^m}_{-1}$), and their $2^m$ additive inverses (referred to as $y_2{^m}, \ldots, y_2{^{m+1}}_{-1}$). Note here that code word $y_i$ corresponds to the information bits making up the natural binary representation of i. If one of these code words is generated and transmitted, it is received as a receive vector $r=(r_0, \ldots, r_{n-1})$. The maximum likelihood decoding of the received vector reduces to the following process:

compute the fast Hadamard Transform (HT)

$$\hat{r}=(\hat{r}_0, \ldots, \hat{r}_{n-1})=rH_m,$$

find I=arg max $|\hat{r}|$, if $\hat{r}_I>0$, then guess $y_I$ was the sent code word, otherwise, guess $y_{I+2}{^m}$ was sent the sent code word, recover the information bits from I of the guessed code word.

Maximum likelihood decoding of a first order Reed-Muller code using the above less complex process requires $m\times(2^m-1)$ additions and $2^m-1$ comparisons. This is much more efficient than the "brute force" (i.e., complex) maximum likelihood decoding process which requires $2^{m+1}\times(2^m-1)$ additions and $2^m-1$ comparisons.

Reference is now once again made to the reduced complexity maximum likelihood decoder for Golay codes devised by Conway and Sloane (see, IEEE Trans. Infor. Theory, vol. 32, pp. 41–50, 1986). It will be remembered that in accordance with the disclosed Conway-Sloane procedure an attempt is made to find a subcode of a given Golay code that is less complex to decode. The given Golay code may then be maximum likelihood decoded by cycling, to achieve a lower overall complexity, over the found subcode and its cosets. The foregoing Conway-Sloane decoding method presents a general premise that for any given highly complex block code, an attempt should be made to find a subcode of that given block code that is less complex to decode. The given complex block code may then be maximum likelihood decoded with reduced complexity by cycling over the subcode and its cosets. Extending this general premise to Reed-Muller codes, and in particular to the second order Reed-Muller code used by the channel encoder 106, it is proposed that reduced maximum likelihood decoding complexity may be obtained by cycling over a found subcode (and its cosets) of the second order Reed-Muller code. The first order Reed-Muller code (discussed above) comprises just such a suitable subcode which, like the parity check for the Golay codes analyzed by Conway and Sloane, and in accordance with the previous decoding description, has a known less complex maximum likelihood decoding solution utilizing a fast Hadamard Transform (as discussed above).

Consideration is now specifically given to a second order (n,k;d) Reed-Muller code C wherein:

$$n = 2^m$$
$$k = 1 + m + \frac{m(m-1)}{2}$$
$$d = 2^{m-r}$$

This second order Reed-Muller code C contains a first order $(n,k^{(1)};d^1)$ Reed-Muller subcode $C^{(1)}$ wherein:

$$n=2^m$$
$$k^{(1)}=1+m$$
$$d^1=2^{m-r}$$

The code words of the second order Reed-Muller code C may be generated as the union of the code words of the first order Reed-Muller subcode $C^{(1)}$ and its cosets in C. To produce the cosets, consideration must be given to another $(n,k^{(2)};d^2)$ Reed-Muller subcode $C^{(2)}$ wherein:

$$n = 2^m$$
$$k^{(2)} = k - k^{(1)} = \frac{m(m-1)}{2}$$
$$d^2 = 2^{m-r}$$

The code words of the Reed-Muller subcode $C^{(2)}$ are denoted $z_0, \ldots, z_{2^{k(2)}-1}$, with $z_0$ being the all zero code word in binary representation. The cosets of the Reed-Muller subcode $C^{(1)}$ are then defined as follows:

for each $z_j$ in the subcode $C^{(2)}$, $$C^{(1,j)}=\{y_i+z_j, \text{ all } y_i \epsilon C^{(1)}\}$$

These cosets $C^{(1,j)}$ are disjoint, and their union is equal to the second order Reed-Muller code C.

With the subcode comprising the first order Reed-Muller subcode $C^{(1)}$ and its cosets $C^{(1,j)}$, the general premise underlying the Conway-Sloane decoding method may be extended to decoding the second order Reed-Muller code C. If a code word in the second order Reed-Muller code C is generated and transmitted, it is received as a receive vector $r=(r_0, \ldots, r_{n-1})$. Instead of comparing r directly to a coset $C^{(1,j)}$, a sign change is first performed to obtain r':

$$r' = r * z_j \quad (3)$$

wherein:
the multiplication (*) is performed on an element by element basis; and
$z_j$ comprises $z_j$ in bipolar form (where 0 in binary becomes +1, and 1 in binary becomes −1).

It is noted here that a code word $y_i+z_j$ in C, with component $y_i$ in $C^{(1)}$ and z in $C^{(2)}$, corresponds to k information bits where the first $k^{(1)}$ bits comprise the natural binary representation of i, and the remaining $k^{(2)}$ bits comprise the natural binary representation of j. The maximum likelihood decoding of the received vector then reduces to the following process:

I=0, ρ=0
for j=0: $2^{k^{(2)}}-1$
   change signs using Equation (3),
   compute the fast Hadamard Transform $$\hat{r}=(\hat{r}_0, \ldots, \hat{r}_{n-1})=r'H_m,$$

find I'=arg max $|\hat{r}|$,
   if $|\hat{r}_{I'}|>\rho$, then
     ρ=$|\hat{r}_{I'}|$,
     if $\hat{r}_{I'}>0$ then I=I', otherwise I=I'+$2^m$,
     J=j,
   end
end
guess $y_I+z_J$ was the sent code word,
recover the information bits from I and J where the first $k^{(1)}$ bits comprise the natural binary representation of I, and the remaining $k^{(2)}$ bits comprise the natural binary representation of J.

Maximum likelihood decoding of a second order Reed-Muller code using the above less complex process requires $2^{k^{(2)}} \times m \times 2^m$ additions and $2^k-1$ comparisons. This is much more efficient than the "brute force" (i.e., complex) maximum likelihood decoding process which requires $2^k \times (2^m-1)$ additions and $2^k-1$ comparisons.

The Hadamard matrix $H_m$ may be rewritten as a product of m matrices:

$$H_m=E_1 \times \ldots \times E_m$$

where $E_i$ is a ($2^m \times 2^m$) matrix with two nonzero (i.e., +1 or −1) entries per column. In addition, for m'<m:

$$F_{m'}=E_1 \times \ldots \times E_{m'}$$

is a block diagonal matrix where the blocks are equal to $H_{m'}$. As discussed above, the fast Hadamard Transform (HT) is taken over the cosets for the $2^{k^{(2)}}$ versions of r' given by Equation (3). An examination of the code words $z_j$ of the Reed-Muller subcode $C^{(2)}$ reveals that parts of the taken fast Hadamard Transform are needlessly recomputed during the recycling operation. Consequently, intermediate values of the Hadamard Transform are stored and used as needed to achieve significant savings in computations.

Figure 2:
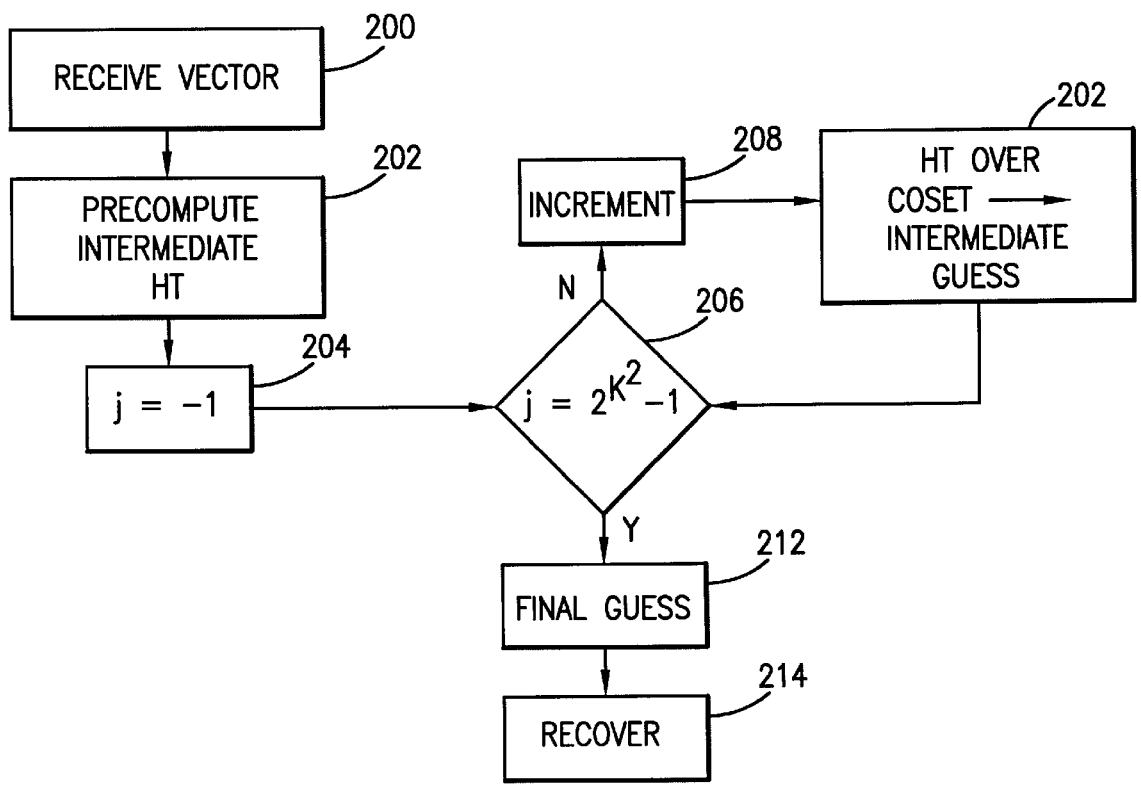
FIG. 2 is a flow diagram illustrating the decoding process implemented by the channel decoder of FIG. 1 for second order Reed-Muller codes.

Reference is now made to FIG. 2 wherein there is shown a flow diagram illustrating the decoding process implemented by the channel decoder 120 of FIG. 1 for second order Reed-Muller codes. In step 200, the vector of the coded information is received. The process then precomputes and stores intermediate fast Hadamard Transform values in step 202. The decoder is then initialized in step 204 with j=−1. A determination is then made in step 206 as to whether all cosets have been exhausted (i.e., whether j=$2^{k^2}$−1). If not, j is incremented in step 208. Then, in step 210, for the current value of j, an intermediate codeword guess is obtained over the coset $C^{(1,j)}$ of the subcode $C^{(1)}$. The precomputed intermediate Fast Hadamard Transform values from step 202 are retrieved and further processed to complete the Hadamard Transform to produce the intermediate codeword guess. The process then returns to decision step 206. Once the process has cycled over all the cosets $C^{(1,j)}$ of the subcode $C^{(1)}$, and found through completion of the Fast Hadamard Transform process an intermediate codeword guess at each cycle, the final codeword guess (comprising the best of the intermediate codeword guesses) is obtained therefrom in step 212. Decoding of the final guess is then performed in step 214.

A more complete understanding of the present invention may be obtained now by examining the reduced complexity maximum likelihood decoding process for a specific second order Reed-Muller code. Take, for example, the second order (32,16;8) Reed-Muller code C (m=4, r=2). One subcode $C^{(1)}$ thereof comprises the first order (32,6;16) Reed-Muller code. Also, subcode $C^{(2)}$ comprises a (32,10;8) subcode of the second order Reed-Muller code. For the subcode $C^{(2)}$, its code words are parsed into four blocks s, each of length eight. For s=1,2,3,4, let $A_s$ denote the set of distinct blocks of length eight taken by block s of code words in the subcode $C^{(2)}$. Also, let $\alpha_s$ denote the size of $A_s$. Then, $\alpha_1=8$, $\alpha_2=64$, $\alpha_3=64$, and $\alpha_4=128$.

If a code word in the second order Reed-Muller code C is generated and transmitted, it is received as a receive vector $r=(r_0, \ldots, r_{n-1})$. The vector r is then parsed into four blocks $r_1, r_2, r_3, r_4$ of length eight each. As an alternative, it is noted that parsing into eight blocks of length four each, or perhaps something in between, is also equally available. The same is true for two blocks of length sixteen each, or sixteen blocks of length two each. The choice of four blocks of length eight each yields the best compromise between computation and storage. For each $r_s$, $\alpha_s$ Hadamard Transforms are computed and stored using the eight-by-eight matrix $H_3$. Then, for each code word $z_j$, the appropriate values of the $\alpha_s$ Hadamard Transforms are retrieved from memory, and used to complete the Hadamard Transform for multiplying the retrieved values by $E_4 \times E_5$. In this regard, it noted that $F_3$ is a 32×32 block diagonal matrix where each block is equal to $H_3$, and that $H_5 = F_3 \times E_4 \times E_5$. Consequently, multiplying the intermediate values by $E_4 \times E_5$ completes the Hadamard Transform of length thirty-two.

Some simplifications are available. Looking first at the sets $A_s$, the additive inverse of each pattern in $A_4$ is also in $A_4$. Accordingly, the sixty-four included additive inverses may be deleted since their Hadamard Transforms need not be computed, giving $A'_s$ with $\alpha'_4 = 64$. Then, $A'_s = A_s$, and $\alpha_s = \alpha_s$ for s=1,2,3. It is next recognized that in some instances the pattern u in $A'_s$ coincides with a row of $H_3$ or its additive inverse (except for the first row). Accordingly:

$$(r_s * \underline{u})H_3 = r_s H_3 P \qquad (4)$$

wherein:

P is simply a permutation.

Hence, there is no need to compute and store the Hadamard Transforms for such a pattern u in $A'_s$, giving $A''_s$ with $\alpha''_s = 57$ for s=2,3,4. Then, $A''_s = A'_s$, and $\alpha''_s = \alpha'_s$ for s=1. In summary, we then obtain new sets $A''_s$ with respective sizes of $\alpha''_1 = 8$, $\alpha''_2 = 57$, $\alpha''_3 = 57$, and $\alpha''_4 = 57$, and $$\sum_s \alpha_s = 179.$$

A full description of the operation of the channel decoder 120 may now be given. Let, $u_{s,1}$ denote pattern number 1 in $A''_s$. Then, let:

$$\hat{r}_{s,l} = (r_s * \underline{u}_{s,l})H_3 \qquad (5)$$

For each code word $z_j$ of the Reed-Muller subcode $C^{(2)}$, let l(j,s) denote the appropriate index in $A''_s$ pointing to the location of block s in $z_j$, and let P(j,s) denote the permutation matrix to account, if needed, for Equation (4). The maximum likelihood decoding of the received vector by the channel decoder 120 for the second order (32,16;8) Reed-Muller code is then implemented by the following process:

compute $\hat{r}_{s,1}$, s=1,2,3,4, l=1, . . . , $\alpha''_s$, according to
    Equation (5),
  I=0, ρ=0
  for j=0: $2^{k^{(2)}} - 1$
    access stored values of $\hat{r}_{s,l}$, s=1,2,3,4,
    permute values using P(j,s), s=1,2,3,4, if needed,
      multiply by $E_4 \times E_5$ to complete the Hadamard Transform of $\hat{r}$,
    find I'=arg max $|\hat{r}|$,
    if $|\hat{r}_{I'}| > \rho$, then
      $\rho = |\hat{r}_{I'}|$,
      if $\hat{r}_{I'} > 0$ then I=I', otherwise I=I'+$2^m$,
      J=j,
    end
  end
  guess $y_I + z_J$ was sent code word,
    recover the information bits from I and J.

Each $H_3$ requires $3 \times 2^3 = 24$ additions, for a total of 24×179=4,296 additions. Each $E_4 \times E_5$ requires 2×32 additions, and must be repeated $2^{10}$ times, for a total of 65,536 additions. Overall, this gives 69,832 additions. To store the intermediate Hadamard Transform values, 179×8=1,432 memory units must be provided. Finally, there is a need for $2^{16} - 1$ comparisons. This is much more efficient than the "brute force" (i.e., complex) maximum likelihood decoding process which requires $2^{16} \times 31 = 2,031,616$ additions, or a ratio of twenty-nine times more additions than the reduced complexity implementation of the present invention.

Utilizing the teachings herein, as well as the teachings of commonly assigned, co-pending U.S. application for patent Ser. No. 08/768,530, filed Dec. 18, 1996, by Ali S. Khayrallah, et al., the reduced complexity maximum likelihood decoding process of the present invention may be extended to shortened forms of second order Reed-Muller codes such as the second order (30,14;8) shortened Reed-Muller code, or the second order (28,14;6) shortened Reed-Muller code. Thus, to extend the efficient decoding process described above for use in connection with the decoding of shortened Reed-Muller codes, the generator matrix for the Reed-Muller code is modified to produce a modified generator matrix that is specific for and tailored to the decoding of each shortened code. The modified generator matrix is then efficiently implemented in the efficient decoding process to identify the best codeword for conversion to its corresponding information bits for output. In particular, the modified generator matrix comprises the Reed-Muller code generator matrix with specially chosen rows and columns deleted.

The channel decoder 120 is preferably implemented as a specialized digital signal processor (DSP) or in an application specific integrated circuit (ASIC). It will, of course, be understood that the channel decoder 120 may alternatively be implemented with the de-interleaver 118 and source decoder 122 in combination or using discrete components and perhaps distributed processing. In either case, the de-interleaver 118, channel decoder 120 and source decoder 122 each perform and implement the functional operations previously described.

Although preferred embodiments of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method for maximum likelihood decoding of a received vector comprising second order Reed-Muller code encoded information bits, comprising the steps of:

cycling over cosets of a subcode of a second order Reed-Muller code used to encode the information bits;

performing a Hadamard Transformation on the received vector compared to each coset to obtain an intermediate codeword guess for each cycle; and recovering, following cycling through each of the cosets, the originally encoded information bits from a final codeword guess comprising a best one of the intermediate codeword guesses.

2. The method as in claim 1 wherein the Hadamard Transformation comprises a Fast Hadamard Transformation.

3. The method as in claim 1 further including the step of precomputing and saving a plurality of intermediate values for the Hadamard Transformation of the received vector.

4. The method as in claim 3 wherein the step of performing a Hadamard Transformation on the received vector further comprises the steps of:

recalling necessary ones of the precomputed intermediate values at each cycle; and completing the Hadamard Transformation of the received vector using the recalled precomputed intermediate values to obtain the intermediate codeword guess with respect to each coset.

5. The method as in claim 1 wherein the second order Reed-Muller code comprises a Kerdock code.

6. The method as in claim 1 wherein the second order Reed-Muller code comprises a shortened form of the second order Reed-Muller code.

7. The method as in claim 1 wherein the subcode is a first order Reed-Muller code.

8. A method for maximum likelihood decoding of a received vector comprising encoded information bits, comprising the steps of:

cycling over cosets of a subcode of a code used to encode the information bits, the subcode comprising a first order Reed-Muller code;

performing a Hadamard Transformation on the received vector compared to each coset to obtain an intermediate codeword guess for each cycle; and recovering, following cycling through each of the cosets, the originally encoded information bits from a final codeword guess comprising a best one of the intermediate codeword guesses.

9. The method as in claim 8 wherein the Hadamard Transformation comprises a Fast Hadamard Transformation.

10. The method as in claim 8 further including the step of precomputing and saving a plurality of intermediate values for the Hadamard Transformation of the received vector.

11. The method as in claim 10 wherein the step of performing a Hadamard Transformation on the received vector further comprises the steps of:

recalling necessary ones of the precomputed intermediate values at each cycle; and completing the Hadamard Transformation of the received vector using the recalled precomputed intermediate values to obtain the intermediate codeword guess with respect to each coset.

12. The method as in claim 8 wherein the code comprises a second order Reed-Muller code.

13. The method as in claim 8 wherein the code comprises a Kerdock code.

14. The method as in claim 8 wherein the code comprises a shortened form of a second order Reed-Muller code.

* * * * *